United States Patent
Wu et al.

(10) Patent No.: US 9,378,800 B2
(45) Date of Patent: Jun. 28, 2016

(54) MEMORY CONTROLLER AND ASSOCIATED SIGNAL GENERATING METHOD

(71) Applicant: MStar Semiconductor, Inc., Hsinchu County (TW)

(72) Inventors: Zong-Han Wu, Hsinchu County (TW); Chen-Nan Lin, Taipei (TW); Chung-Ching Chen, Hsinchu County (TW); Hsin-Cheng Lai, Hsinchu County (TW)

(73) Assignee: MSTAR SEMICONDUCTOR, INC., Hsinchu County (TW)

( * ) Notice: Subject to any disclaimer, the term of this patent is extended or adjusted under 35 U.S.C. 154(b) by 344 days.

(21) Appl. No.: 14/248,490

(22) Filed: Apr. 9, 2014

(65) Prior Publication Data
US 2014/0325137 A1    Oct. 30, 2014

(30) Foreign Application Priority Data

Apr. 30, 2013    (TW) .............................. 102115489 A

(51) Int. Cl.
*G11C 8/18*      (2006.01)
*G11C 7/10*      (2006.01)
*G11C 11/406*    (2006.01)
*G06F 13/16*     (2006.01)

(52) U.S. Cl.
CPC ...... *G11C 11/40611* (2013.01); *G06F 13/1689* (2013.01); *G11C 7/10* (2013.01); *G11C 8/18* (2013.01)

(58) Field of Classification Search
CPC ...... G11C 7/22; G11C 7/222; G11C 11/4076; G06F 13/1689
See application file for complete search history.

(56) References Cited

U.S. PATENT DOCUMENTS

| 2004/0081011 A1* | 4/2004 | Maruyama | G11C 11/406 365/233.1 |
| 2014/0043925 A1* | 2/2014 | Lin | G11C 7/1045 365/193 |

* cited by examiner

*Primary Examiner* — John Lane
(74) *Attorney, Agent, or Firm* — WPAT, PC; Justin King

(57) ABSTRACT

The invention is directed to a memory controller and an associated signal generating method. By appropriately arranging a sequence according to which command signals are generated and expanding a latching interval of a part of address signals, not only the memory controller is enabled to control the DDR memory modules in a functional manner to further overcome issues of conventionally small latching intervals, but also system stability and access performance are reinforced as the memory access clock speed continue to increase.

17 Claims, 5 Drawing Sheets

| command | A[11], A[9:0] | A[15:12] | A[10] | BANK[2:0] |
|---|---|---|---|---|
| NOP | x | x | x | x |
| PRE | x | x | logic: 0 | effective |
| ACT | effective | effective | effective | effective |
| Write | effective | x | logic: 0 | effective |
| Read | effective | x | logic: 0 | effective |

US 9,378,800 B2

MEMORY CONTROLLER AND ASSOCIATED SIGNAL GENERATING METHOD

This application claims the benefit of Taiwan application Serial No. 102115489, filed Apr. 30, 2013, the subject matter of which is incorporated herein by reference.

BACKGROUND OF THE INVENTION

1. Field of the Invention

The invention relates in general to the field of memories, and more particularly to a memory controller and an associated signal generating method.

2. Description of the Related Art

A memory controller, generally connected to a memory module, writes data into the memory module or reads data from the memory module. One of the most common memory modules is a double data rate (DDR) memory module.

FIG. 1A and FIG. 1B show a schematic diagram of a connection relationship and an eye diagram of control signals between a memory controller and a memory module, respectively. A memory controller 100 and a DDR memory module 110 are disposed on a printed circuit board (PCB). The control signals at least includes a clock signal (CLK1), an address signal (A), a command signal (CMD), and a bank control signal (BANK). The command signal (CMD) includes a write enable signal (WE), a row address strobe signal (RAS), and a column address strobe signal (CAS). The bank control signal (BANK) is present in form of bank control signals BANK[2:0] at 3 pins, and the address (A) signal is present in form of address signals A[15:0] at 16 pins.

The memory controller 100 utilizes the control signals to control and access the DDR memory module 110, e.g., to read and write data. The DDR memory module 110 latches data in the address signal (A), the command signal (CMD) and the bank control signal (BANK) according to a signal edge (e.g., a rising edge or a falling edge) of the clock signal (CLK1). Thus, the memory controller 100 needs to appropriately adjust the phase of the clock signal (CLK1), so that the DDR memory module 100 is allowed to successfully latch the data in all of the control signals according to the signal edge of the clock signal (CLK1). For illustration purposes, in the example in the description below, the rising edge of the clock signal (CLK1) is utilized to latch the signals.

As shown in FIG. 1B, a period of the clock signal (CLK1) is T, and periods of the address signal (A), the command signal (CMD) and the bank control signal (BANK) are also T. However, as driving capabilities of the control signals are different, latching intervals (or referred to as data effective ranges) of the control signals are smaller than T. Therefore, to prevent the control signals from latching these control signals outside the latching intervals and thus from causing errors, the memory controller 100 needs to adjust the rising edge of the clock signal (CLK1) to within the latching intervals of these control signals.

As shown in FIG. 1B, the rising edge of the clock signal (CLK1) is adjusted to the latching interval (Eye_cmd) of the command signal (CMD), the latching interval (Eye_bank) of the bank control signal (BANK), and the latching interval (Eye_addr) of the address signal (A). It is apparent that the latching intervals of the above signals are all smaller than T. More particularly, having a large number of signals, the address signal (A) has a smallest latching interval (Eye_addr).

As the access speed of dynamic random access memories (DRAMs) continue to increase, DDR2 modules have evolved to DDR3 modules. However, with the increasing speed of memory modules, signal quality is significantly lowered. On further account of variations of PCBs and different pins of the memory modules of different specifications, slight differences may exist in the time that control signals need to travel from the memory controller to the memory module, and the rising time and falling time when signals are changed may be increased. As a result, the latching intervals of the control signals become smaller.

FIG. 2A and FIG. 2B show a schematic diagram of a connection relationship and an eye diagram of control signals between a memory controller and two memory modules, respectively. When controlling two DDR memory modules 210 and 220 by a memory controller 200, a first clock signal (CLK1) connects to the first DDR memory module 210, and a second clock signal (CLK2) connects to the second DDR memory module 220. Further, the two DDR memory modules 210 and 220 share an address signal (A), a command signal (CMD), and a bank control signal (BANK). That is, the first DDR memory module 210 latches the data in the address signal (A), the command signal (CMD) and the bank control signal (BANK) according to the first clock signal (CLK1); the second DDR memory module 220 latches the data in the address signal (A), the command signal (CMD) and the bank control signal (BANK) according to the second clock signal (CLK2).

The memory controller 200 is required to drive a pin count that is twice of that of the memory in 1A. In addition, considering variations of PCBs and different pins of the two DRAMs, quality of the signals are further deteriorated. Such signal deterioration is particularly severe for the address signal (A). Compared to FIG. 1B, the latching intervals in FIG. 2B are even smaller, and particularly the latching interval (Eye_addr) of the address signal (A) is extremely small. That is, with the extremely small latching interval (Eye_addr) of the address signal (A), it is made even more challenging for the memory controller 200 to make adjustment to provide appropriate phases for the clock signals (CLK1) and (CLK2) that allow the two DDR memory modules 210 and 220 to successively latch the signals.

Under high-speed requirements, the quality of all of the signals cannot be easily qualified. Therefore, there is a need for a solution that overcomes the above issues.

SUMMARY OF THE INVENTION

The invention is directed to a memory controller and an associated signal generating method. By limiting the method for generating a command signal and expanding latching intervals of a part of address signals, memory modules are enabled to operate in a functional manner.

To achieve the above object, a signal generating method for memory controller that controls a first memory module is provided. The signal generating method includes: generating a first clock signal, a bank control signal and a first-part address signal all having a signal period of one unit time; generating a command signal having a signal period of the unit time, the command signal including multiple command groups each having a first command, a second command, a third command and fourth command that are consecutive; and generating a second-part address signal having a signal period of twice of the unit time. A first signal edge of the first clock signal occurs during latching intervals of the command signal, the bank control signal and the first-part address signal; a second signal edge of the first clock signal occurs during latching intervals of the command signal, the bank control signal, the first-part address signal and the second-part address signal; a third signal edge of the first clock signal occurs during latching intervals of the command signal, the bank control signal and the first-part address signal; and a fourth signal edge of the first clock signal occurs during the latching intervals of the command signal, the bank control signal, the first-part address signal and the second-part address signal.

A memory controller is further provided by the present invention. The memory controller, connected to a first memory module, includes: a clock generating unit, configured to generate a first clock signal having a signal period of a unit time to the first memory module; a control signal translating unit, configured to generate a command signal having a signal period of the unit time to the first memory module, the command signal including multiple command groups each having a first command, a second command, a third command and a fourth command that are consecutive; and an address translating unit, configured to generate a bank control signal and a first-part address signal both having a signal period of the unit time to the first memory module, and to generate a second-part address signal having a signal period of twice of the unit time to the first memory module. A first signal edge of the first clock signal occurs during latching intervals of the command signal, the bank control signal and the first-part address signal; a second signal edge of the first clock signal occurs during latching intervals of the command signal, the bank control signal, the first-part address signal and the second-part address signal; a third signal edge of the first clock signal occurs during latching intervals of the command signal, the bank control signal and the first-part address signal; and a fourth signal edge of the first clock signal occurs during the latching intervals of the command signal, the bank control signal, the first-part address signal and the second-part address signal.

The above and other aspects of the invention will become better understood with regard to the following detailed description of the preferred but non-limiting embodiments. The following description is made with reference to the accompanying drawings.

DETAILED DESCRIPTION OF THE INVENTION

Control signals of a DDR memory module include a first clock signal (CLK1), a second clock signal (CLK2), a command signal (CMD), a bank a control signal (BANK), and an address signal (A). The command signal (CMD) includes a write enable signal (WE), a row address strobe signal (RAS), and a column address strobe signal (CAS). For example, the bank control signal (BANK) at three pins is BANK[2:0]; the address signal (A) at 16 pins is functionally categorized into a $10^{th}$ address signal A[10] and other address signals A[0:9] and a[11:15].

Figure 1A:
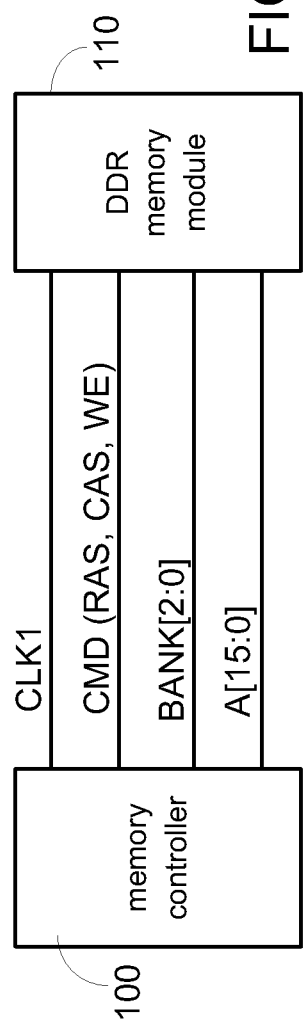
FIG. 1A and FIG. 1B are a connection relationship and an eye diagram of signals between a memory controller and memory module, respectively.
Figure 1B:
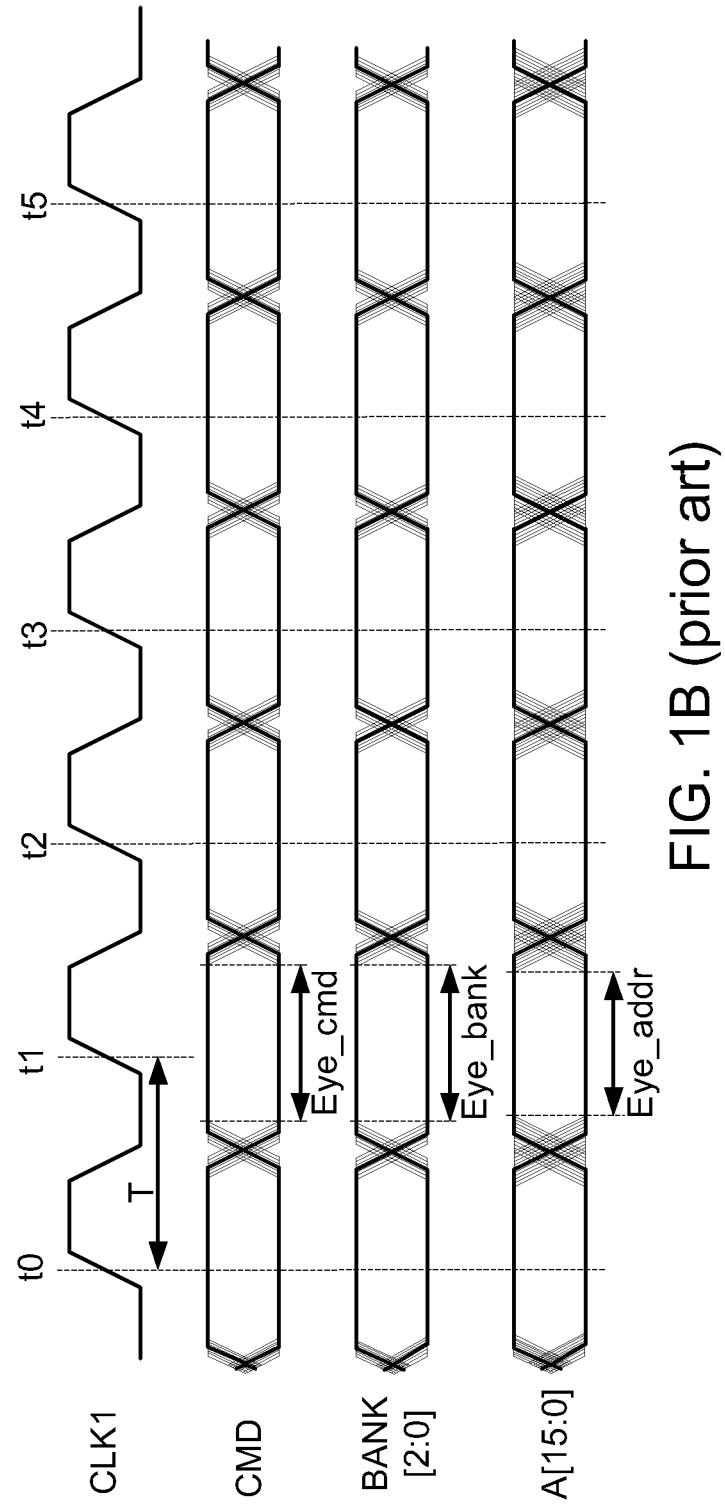
Figure 2A:
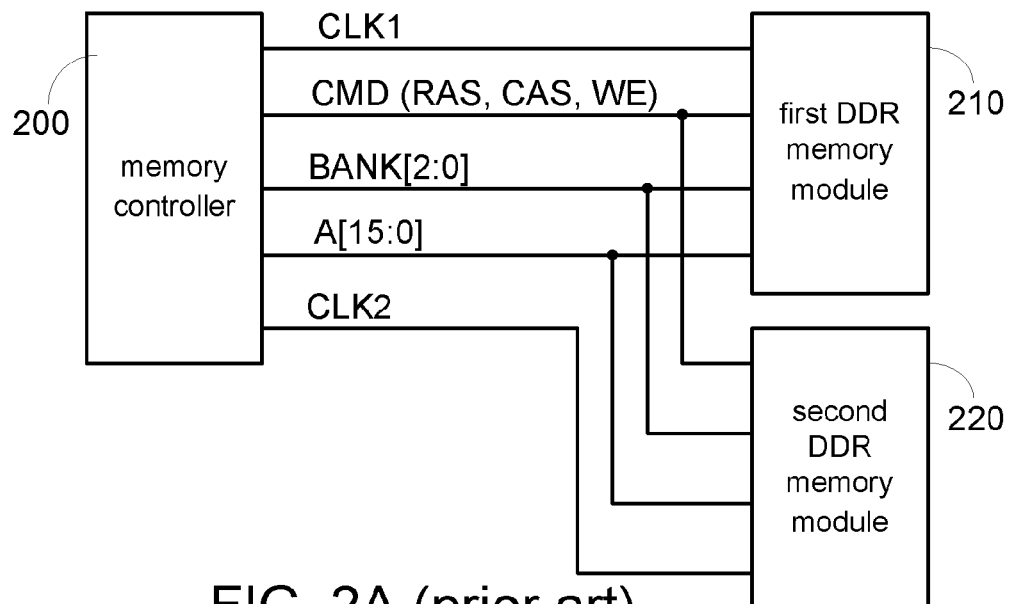
FIG. 2A and FIG. 2B are a connection relationship and an eye diagram of signals between a memory controller and two memory modules, respectively.
Figure 2B:
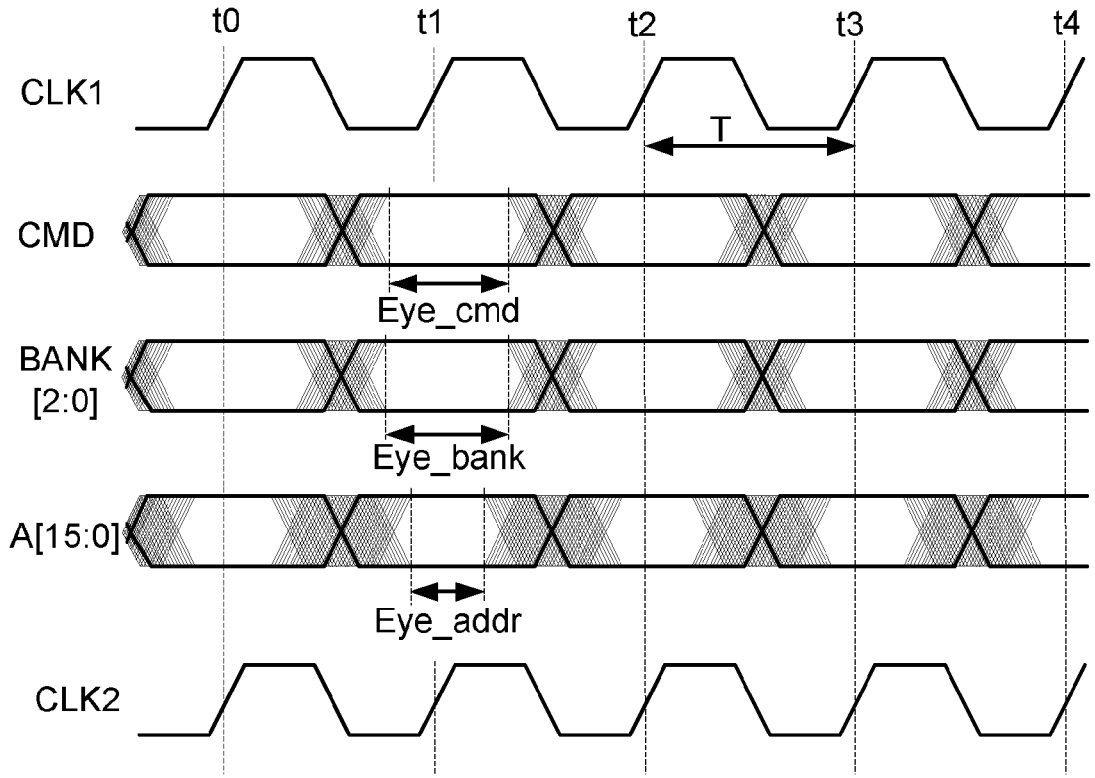
Figures 3, 4A:
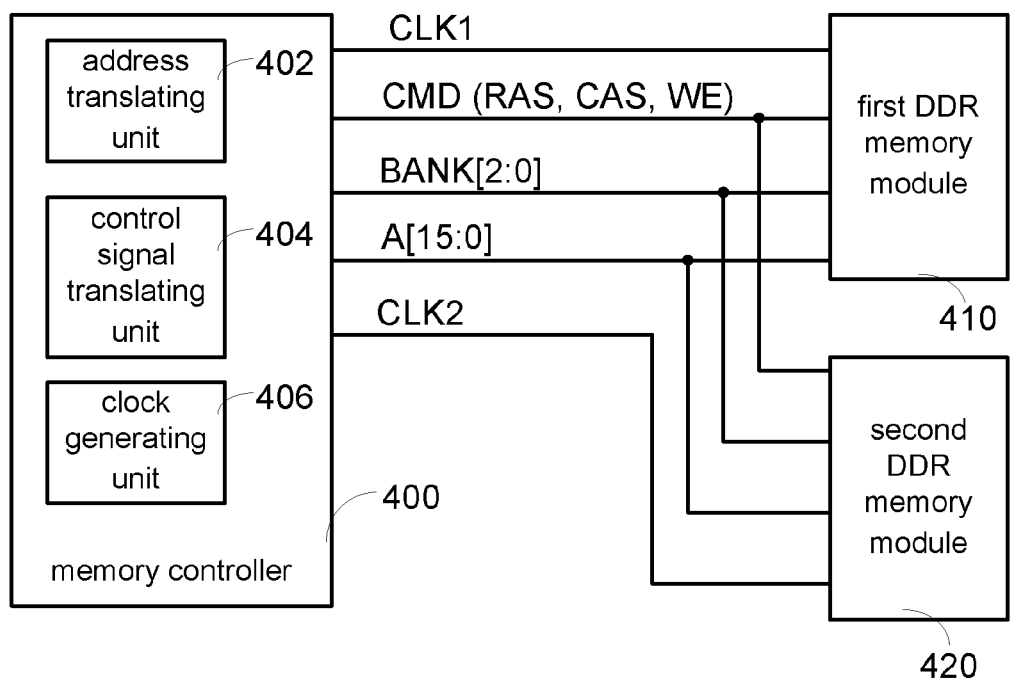
FIG. 3 is a schematic diagram of data of commands executed by a DDR memory module and corresponding control signals.
FIG. 4A and FIG. 4B are a connection relationship and an eye diagram of signals between a memory controller and memory module according to an embodiment of the present invention, respectively.

FIG. 3 shows a schematic diagram of data of commands executed by a DDR memory module and corresponding control signals. The command signal includes a no operation command (NOP), a bank bus pre-charge command (PRE), a drive bank bus command (ACT), a write command (Write) and a read command (Read).

During the NOP command, the address signals A[15:0] at the 16 pins and the bank control signals BANK[2:0] are "don't care". That is, when executing the NOP command, data in the address signals A[15:0] and the bank control signals BANK[2:0] is omitted.

During the PRE command, effective data needs to be provided in the bank control signals BANK[2:0], and data of logic "0" needs to be provided in the $10^{th}$ address signal A[10]. Meanwhile, other address signals A[0:9] and A[11:15] are omitted.

During the ACT command, effective data needs to be provided in the bank control signals BANK[2:0], and also in the address signals A[15:0] at the 16 pins.

During the Write and Read commands, effective data needs to be provided in the bank control signals BANK[2:0] as well as in the address signals A[11] and A[9:0] at the 11 pins, and data in logic "0" needs to be provided in the $10^{th}$ address signal A[10]. Meanwhile, the address signals A[15:12] at 4 pins is omitted.

Known from the above characteristic of commands, during the NOP command and the PRE command, the DDR memory module need not consider the data in the address signals A[0:9] and A[11:15]. In one embodiment, the command signals outputted by a memory controller are grouped into command groups each having four commands. The four commands are sequentially a command 1 (cmd1), a command 2 (cmd2), a command 3 (cmd3), and a command 4 (cmd4). During the command 1 (cmd1) and the command 3 (cmd3), only either the NOP command or the PRE command can be generated. During the command 2 (cmd2) and the command 4 (cmd4), any of the above commands may be generated.

Figure 4B:
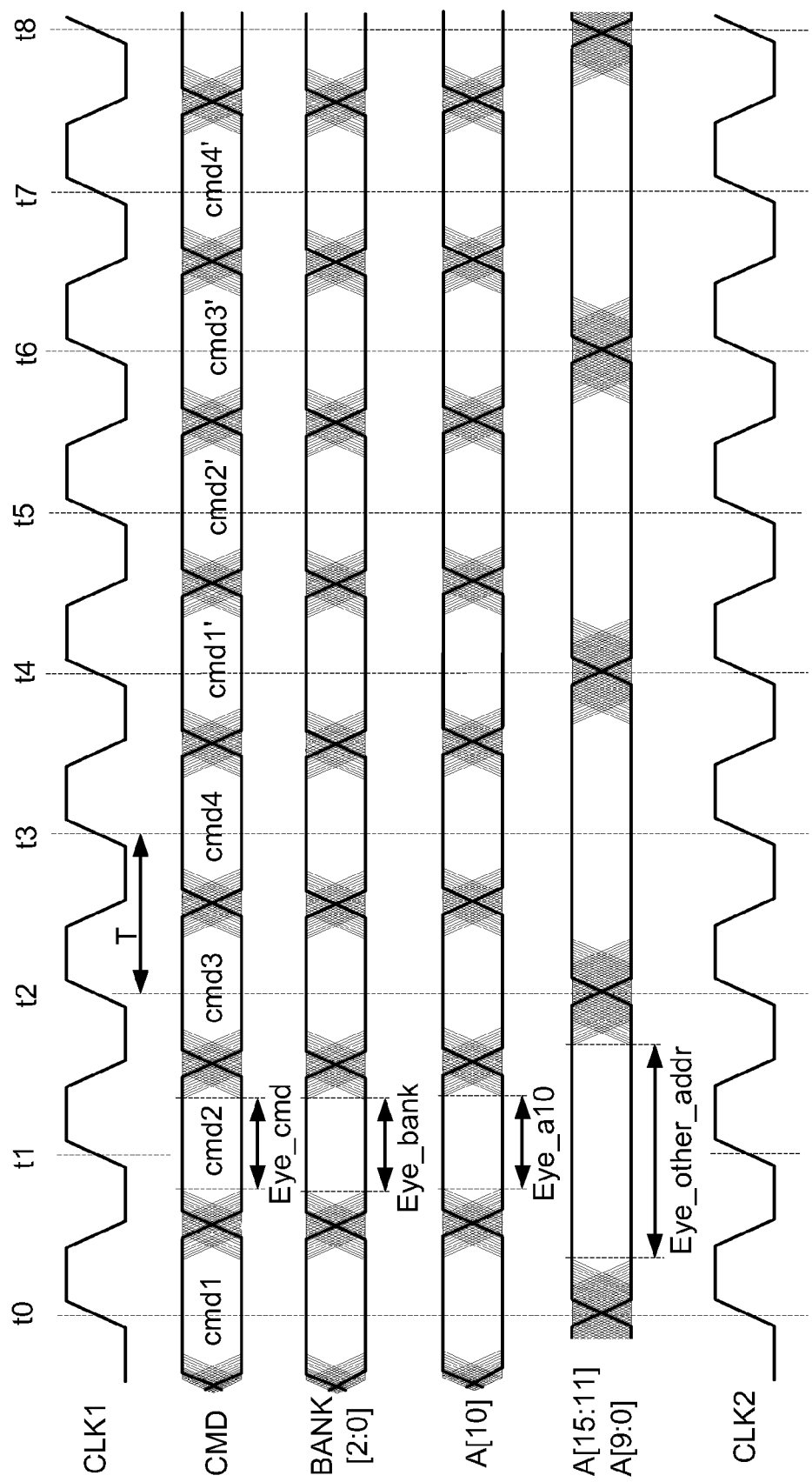

FIG. 4A and FIG. 4B show a schematic diagram of a connection relationship and an eye diagram of control signals between a memory controller and a memory module according to an embodiment of the present invention, respectively. A memory controller 400 includes an address translating unit 402, a control signal translation unit 404, and a clock generating unit 406. The clock generating unit 406 generates the first clock signal (CLK1) and the second clock signal (CLK2); the control signal translating unit 404 generates the command signal (CMD); and the address translating unit 402 generates the bank control signal (BANK) and the address signal (A). Depending on the number of DDR memory modules, the clock generating unit 406 may generate individual clock signals to the DDR memory modules, respectively.

As shown in FIG. 4A, the first clock signal (CLK1) connects to a first DDR memory module 410, and the second clock signal (CLK2) connects to a second DDR memory module 420. Further, the first DDR memory module 410 and the second DDR memory module 420 share the address signal (A), the command signal (CMD) and the bank control signal (BANK). That is, the first DDR memory module 210 latches the data in the address signal (A), the command signal (CMD) and the bank control signal (BANK) according to the first clock signal (CLK1); the second DDR memory module 220 latches the data in the address signal (A), the command signal (CMD) and the bank control signal (BANK) according to the second clock signal (CLK2).

In one embodiment, the command signal sent out by the memory controller 40 includes multiple command groups, each of which having four consecutive commands. As shown in FIG. 4B, the first command group is sequentially a command 1 (cmd1), a command 2 (cmd2), a command 3 (cmd3) and a command 4 (cmd4); the second command group is sequentially a command 1' (cmd1'), a command 2' (cmd2'), a command 3' (cmd3') and a command 4' (cmd4').

In the embodiment, it is limited that the first command and the third command in the command groups are either the NOP command or the PRE command. When the DDR memory modules 410 and 420 execute the NOP command and the PRE command, data in the other address signals A[0:9] and A[11:15] is omitted. Preferably, when the memory controller 400 generates the first command and the third command of the command groups, the rising edges of the first clock signal (CLK1) and the second clock signal (CLK2) are not limited to fall within the latching interval (Eye_other_addr) of the other address signals A[0:9] and A[11:15]. In other words, when the memory controller 400 generates the first command and the third command of the command groups, no error will be incurred despite that the rising edges of the first clock signal (CLK1) and the second clock signal (CLK2) fall outside the latching interval (Eye_other_addr).

Referring to FIG. 4B, periods of the first clock signal (CLK1) and the second clock signal (CLK2) outputted by the clock generator 406 in the memory controller 400 are T, a signal period of the command signal (CMD) outputted by the control signal translating unit 404 in the memory controller 400 is T, and signal periods of the bank control signals BANK [2:0] and the $10^{th}$ address signal A[10] outputted by the address translating unit 402 in the memory controller 400 are also T. Further, a signal period of the other address signals A[0:9] and A[11:15] outputted by the address translating unit 404 in the memory controller 400 is 2 T. It should be noted that, the latching interval (Eye_other_addr) of the other address signals A[0:9] and A[11:15] is enlarged.

As shown in FIG. 4B, at time points t0, t2, t4 and t6 are sequentially the command 1 (cmd1) of the first command group, the command 3 (cmd3) of the first command group, the command 1' (cmd1') of the second command group, and the command 3' (cmd3') of the second command group. The rising edges of the first clock signal (CLK1) and the second clock signal (CLK2) are located within the latching interval (Eye_cmd) of the command signal, the latching interval (Eye_bank) of the bank control signal (BANK), and the latching interval (Eye_a10) of the $10^{th}$ address signal. However, the rising edges of the first clock signal (CLK1) and the second clock signal (CLK2) fall outside the latching interval (Eye_other_addr) of the other address signals A[0:9] and A[11:15]. That is, although correct data of the address signals A[0:9] and A[11:15] cannot be obtained from the commands that the two DDR memory modules 410 and 420 receive at the time points t0, t2, t4 and t6, the two DDR modules 410 and 420 are nonetheless capable of correctly executing the NOP command or the PRE command.

Further, at time points t1, t3, t5 and t7 are sequentially the command 2 (cmd2) of the first command group, the command 4 (cmd4) of the first command group, the command 2' (cmd2') of the second command group, and the command 4' (cmd4') of the second command group. The rising edges of the first clock signal (CLK1) and the second clock signal (CLK2) are located within the latching interval (Eye_cmd) of the command signal (CMD), the latching interval (Eye_bank) of the bank control signal, the latching interval (Eye_a10) of the $10^{th}$ address signal and the latching interval (Eye_other_addr) of the other address signals A[0:9] and A[11:15]. It should be noted that, correct data of the other address signals A[0:9] and A[11:15] can be obtained from the commands that the two DDR memory modules 410 and 420 receive at the time points t1, t3, t5 and t7, and the commands can be correctly executed.

As explained in the above description, in the embodiment, the memory controller is limited to output multiple command groups each having four consecutive commands. The first command and the second command are either a NOP command or a PRE command. Thus, the signal period of the other address signals A[0:9] and A[11:15] can be increased to 2 T that further expands the corresponding latching interval (Eye_other_address), thereby more readily latching data of the control signals.

It should be noted that, in the present invention, the number of DDR memory modules is not limit to the exemplary number of two as in the above embodiment. The present invention is applicable for controlling one single DDR memory module or more than two DDR memory modules.

Figure 5:
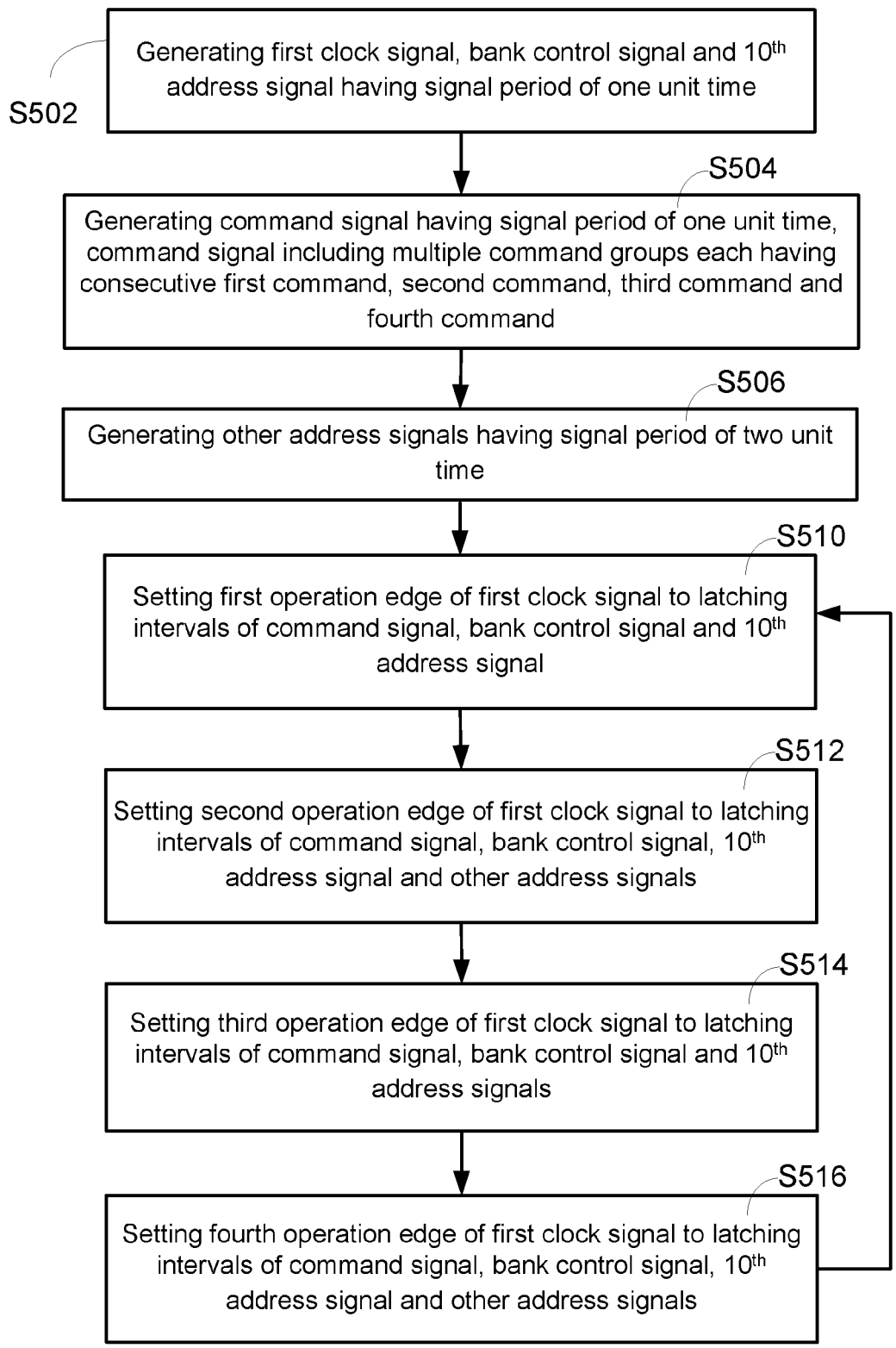
FIG. 5 is a flowchart of a signal generating method of a memory controller according to an embodiment of the present invention.

FIG. 5 shows a flowchart of a signal generating method of a memory controller according to an embodiment of the present invention. In one embodiment, the address signal is divided into two parts—the $10^{th}$ address signal A[10] as a first-part address signal, and the other address signals A[0:9] and A[11:15] as second-part address signals.

In step S502, a first clock signal, a bank control signal and the first-part address signal, all having a signal period of one unit time, are generated. In step S504, a command signal having a signal period of the one unit time is generated. The command signal includes multiple command groups, each of which having a first command, a second command, a third command and a fourth command that are consecutive. In step S506, the second-part address signals having a signal period of two unit time are generated.

In step S510, the clock generating unit 406 sets a first signal edge of the first clock signal to latching intervals of the command signal, the bank control signal and the first-part address signal, and the DDR memory module executes a first command. In step S512, a second signal edge of the first clock signal is set to the lathing intervals of the command signal, the bank control signal, the first-part address signal and the second-part address signals, and the DDR memory executes a second command. In step S514, a third signal edge of the first clock signal is set to the latching intervals of the command signal, the bank control signal and the first-part address signal, and the DDR memory executes a third command. In step S516, a fourth signal edge of the first clock signal is set to the latching intervals of the command signal, the bank control signal, the first-part address signal and the second-part address signals, and the DDR memory module executes a fourth command.

According to the method in FIG. 5, it means that one command group is completely executed after completing steps S510 to S516, and a next command group is to be executed when the process returns to step S510. The unit time above is the period of the first clock, and the first command and the third command of the command groups are either a NOP command or a PRE command.

It is known from the above description that, in the embodiments, with the command groups and by prolonging the signal period of the other address signals A[0:9] and A[11:15] to two unit time, the latching interval of these other address signals A[0:9] and A[11:15] can be expanded. Thus, not only the memory controller is enabled to control the DDR memory modules in a functional manner to further overcome issues of conventionally small latching intervals, but also system stability and access performance are reinforced as the memory access clock speed continue to increase.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A signal generating method of a memory controller, for controlling a first memory module, comprising:
    generating a first clock signal, a bank control signal and a first-part address signal that have a signal period of a unit time;
    generating a command signal having a signal period of the unit time, wherein the command signal comprises a plurality of command groups each having a first command, a second command, a third command and a fourth command that are consecutive; and
    generating a second-part address signal having a signal period twice of the unit time;
    wherein, a first signal edge of the first clock signal occurs during latching intervals of the command signal, the bank control signal and the first-part address signal; a second signal edge of the first clock signal occurs during latching intervals of the command signal, the bank control signal, the first-part address signal and the second-part address signal; a third signal edge of the first clock signal occurs during latching intervals of the command signal, the bank control signal and the first-part address signal; and a fourth signal edge of the first clock signal occurs during the latching intervals of the command signal, the bank control signal, the first-part address signal and the second-part address signal.

2. The signal generating method according to claim 1, for further controlling a second memory module, comprising:
    generating a second clock signal having a signal period of the unit time;
    wherein, a first signal edge of the second clock signal occurs during latching intervals of the command signal, the bank control signal and the first-part address signal; a second signal edge of the second clock signal occurs during latching intervals of the command signal, the bank control signal, the first-part address signal and the second-part address signal; a third signal edge of the second clock signal occurs during latching intervals of the command signal, the bank control signal and the first-part address signal; and a fourth signal edge of the second clock signal occurs during the latching intervals of the command signal, the bank control signal, the first-part address signal and the second-part address signal.

3. The signal generating method according to claim 2, wherein the first memory module and the second memory module are double data rate (DDR) memory modules.

4. The signal generating method according to claim 1, wherein the unit time is a period of the first clock signal.

5. The signal generating method according to claim 1, wherein the first-part address is a $10^{th}$ address signal, and the second-part address is $0^{th}$ to $9^{th}$ address signals and $11^{th}$ to $15^{th}$ address signals.

6. The signal generating method according to claim 1, wherein the first command and the third command are one of a no-operation command and a bank bus pre-charge command.

7. The signal generating method according to claim 1, wherein the second command and the fourth command are one of a no-operation command, a bank bus pre-charge command, a drive bank bus command, a write command and a read command.

8. The signal generating method according to claim 1, wherein the first signal edge and the third signal edge of the first clock signal are located outside the latching interval of the second-part address signal.

9. The signal generating method according to claim 1, wherein the first signal edge, the second signal edge, the third signal edge and the fourth signal edge are a rising edge of the first clock signal.

10. A memory controller, for controlling a first memory module, comprising:
    a clock generating unit, configured to generate a first clock signal having a signal period of a unit time to the first memory module;
    a control signal translating unit, configured to generate a command signal having a signal period of the unit time to the first memory module, wherein the command signal comprises a plurality of command groups each having a first command, a second command, a third command and a fourth command that are consecutive;
    an address translating unit, configured to generate a bank control signal and a first-part address signal that have a signal period of the unit time to the first memory module, and to generate a second-part address signal having a signal period twice of the unit time to the first memory module;
    wherein, a first signal edge of the first clock signal occurs during latching intervals of the command signal, the bank control signal and the first-part address signal; a second signal edge of the first clock signal occurs during latching intervals of the command signal, the bank control signal, the first-part address signal and the second-part address signal; a third signal edge of the first clock signal occurs during latching intervals of the command signal, the bank control signal and the first-part address signal; and a fourth signal edge of the first clock signal occurs during the latching intervals of the command signal, the bank control signal, the first-part address signal and the second-part address signal.

11. The memory controller according to claim 10, further for controlling a second memory module, wherein the clock generating unit further generates a second clock signal having a signal period of the unit time; a first signal edge of the second clock signal occurs during latching intervals of the command signal, the bank control signal and the first-part address signal; a second signal edge of the second clock signal occurs during latching intervals of the command signal, the bank control signal, the first-part address signal and the second-part address signal; a third signal edge of the second clock signal occurs during latching intervals of the command signal, the bank control signal and the first-part address signal; and a fourth signal edge of the second clock signal occurs during the latching intervals of the command signal, the bank control signal, the first-part address signal and the second-part address signal.

12. The memory controller according to claim 11, wherein the first memory module and the second memory module are DDR modules.

13. The memory controller according to claim 10, wherein the first-part address is a $10^{th}$ address signal, and the second-part address is $0^{th}$ to $9^{th}$ address signals and $11^{th}$ to $15^{th}$ address signals.

14. The memory controller according to claim 10, wherein the first command and the third command are one of a no-operation command and a bank bus pre-charge command.

15. The memory controller according to claim 10, wherein the second command and the fourth command are one of a no-operation command, a bank bus pre-charge command, a drive bank bus command, a write command and a read command.

16. The memory controller according to claim 10, wherein the first signal edge and the third signal edge of the first clock signal are located outside the latching interval of the second-part address signal.

17. The memory controller according to claim 10, wherein the first signal edge, the second signal edge, the third signal edge and the fourth signal edge are a rising edge of the first clock signal.

* * * * *